(12) United States Patent
Hummerston et al.

(10) Patent No.: US 6,795,000 B1
(45) Date of Patent: Sep. 21, 2004

(54) PROGRAMMABLE CONVERTER HAVING AN AUTOMATIC CHANNEL SEQUENCING MODE

(75) Inventors: Derek John Hummerston, Oxford (GB); Nicola Mary O'Byrne, Ringaskiddy (IE); Michael A. Byrne, Ballysheedy (IE)

(73) Assignee: Analog Devices, Inc., Norwood, MA (US)

( * ) Notice: Subject to any disclaimer, the term of this patent is extended or adjusted under 35 U.S.C. 154(b) by 251 days.

(21) Appl. No.: 09/982,491

(22) Filed: Oct. 18, 2001

(51) Int. Cl.[7] .......................... H03M 1/00; H03K 23/54
(52) U.S. Cl. ......................... 341/141; 377/46; 377/52; 377/76; 377/124; 708/75
(58) Field of Search .......................... 341/141; 377/46, 377/52, 76, 124, 126, 129; 708/75, 78

(56) References Cited

U.S. PATENT DOCUMENTS

| | | | | | |
|---|---|---|---|---|---|
| 3,083,907 | A | * | 4/1963 | Crocker et al. | 377/33 |
| 5,004,933 | A | * | 4/1991 | Widener | 327/141 |
| 5,598,113 | A | * | 1/1997 | Jex et al. | 326/94 |
| 5,619,201 | A | * | 4/1997 | Imakura | 341/141 |

* cited by examiner

Primary Examiner—Howard L Williams
(74) Attorney, Agent, or Firm—Wolf, Greenfield & Sacks P.C.

(57) ABSTRACT

A counter circuit is provided which is particularly suitable for controlling cyclical events. The counter consists of a chain of logic elements 160, 167, 164 which sequentially pass a '1' along the chain in response to a clock signal. Each element is also responsive to a respective select signal and, if selected, behaves like a latch, whereas if unselected it behaves as if it were not there.

21 Claims, 6 Drawing Sheets

Fig. 1

CONTROL REGISTER DATA IS LOADED IN ON FIRST 12 SCLK CYCLES
SHADOW REGISTER DATA IS LOADED IN ON FIRST 16 SCLK CYCLES

| MSB | | | | | | | | | | LSB |
|---|---|---|---|---|---|---|---|---|---|---|
| WRITE | SEQ | ADD3 | ADD2 | ADD1 | ADD0 | PM1 | PM0 | SHADOW | WEAK/TRI | RANGE | CODING |

Fig. 6

| MSB | | | | | | | | | | | | | | | LSB |
|---|---|---|---|---|---|---|---|---|---|---|---|---|---|---|---|
| $V_{IN}0$ | $V_{IN}1$ | $V_{IN}2$ | $V_{IN}3$ | $V_{IN}4$ | $V_{IN}5$ | $V_{IN}6$ | $V_{IN}7$ | $V_{IN}8$ | $V_{IN}9$ | $V_{IN}10$ | $V_{IN}11$ | $V_{IN}12$ | $V_{IN}13$ | $V_{IN}14$ | $V_{IN}15$ |
| S0 | S1 | S2 | S3 | S4 | S5 | S6 | S7 | S8 | S9 | S10 | S11 | S12 | S13 | S14 | S15 |

Fig. 7

PROGRAMMABLE CONVERTER HAVING AN AUTOMATIC CHANNEL SEQUENCING MODE

FIELD OF INVENTION

The present invention relates to a converter, such as an analog to digital convener, wherein the converter has plurality of input channels, and the sequence in which those channels are converted is programmable.

DESCRIPTION OF PRIOR ART

Multi channel analog to digital converters typically have a single converts therein wvith two or more channels multiplexed into the single convertor through transmission gates. Typically one of the plurality of available channels is selected by explicitly writing the channel number into the control register of the converter using a suitable interface, such as a serial interface.

Such an arrangement is, in terms of processor overhead, cumbersome and inefficient as the channel register has to be programed each the user wants to change the channel to be converted. That is to say, converting P distinct channels requires P distinct control register write operations.

To overcome these problems, some multi channel analog to digital converters have been provided with some form of automatic cycling.

A converter commercially available from Texas Instruments as a 'TLV2548' is an 8 channel converter which has a programmable auto channel sweep function. The user programmes a control register therein, and two of the bits in the control register are decoded to offer one of four preset channel sequences. No other channel sequences are available. The channel sequences are set out as follows:

| Control Register Bits | Sequence Channel Order |
| --- | --- |
| 00 | 0-1-2-3-4-5-6-7 |
| 01 | 0-2-4-6-0-2-4-6 |
| 10 | 0-0-2-2-4-4-6-6 |
| 11 | 0-2-0-2-0-2-0-2 |

Thus, the user must choose one of the preset sequences and cannot mask out channel at their own choosing.

SUMMARY OF THE INVENTION

According to a first aspect of the present invention, there is provided an analog to digital converter, where the converter has N input channels, and where any one or more of the N input channels can be converted in order in response to a control word, the unselected channels being skipped.

It is thus possible to provide an analog to digital converter in which the sequence cycle time to convert all of the channels in a user definable sequence is substantially proportional to the number of channels selected, and wherein the user can freely define those channels which are to be converted in sequence. The user's definition of which channels are to be converted can be supplied as a single command.

Advantageously the analog to digital converter is operable in other modes of operation, such that the number of the next channel to be converted can be explicitly written into the control register, and/or automatic cycling through each and every channel can be instructed.

Advantageously each conversion result output from the converter includes a channel identifier in order to explicitly identify the number of the channel that has been concerted a digital representation of the analog input at that channel. Preferably the output of the converter is provided as a serial word, thereby minimising the number of output pins required by the converter.

Advantageously the control word indicating which channels are to be converted is held in a control register. The register is advantageously N bits long such that each bit corresponds to an associated one of the channels. Thus, control of the converter can be simplified. The control register may be one of a plurality of registers provided for controlling the operation of the digital to analog converter.

According to a second aspect of the present invention there is provided a circuit comprising a plurality of latches having respective inputs and outputs, wherein the latches are arranged such that the output of a latch is provided to the input of a subsequent latch and the latches are responsive to a latch signal, and wherein in a first mode of operation a latch selected by a respective latch mode control signal is arranged to latch a signal received at its input in response to a latch signal, and in a second mode of operation selected by the latch mode control sign the input at the latch is transferred directly to its output irrespective of the state of the latch signal.

The term "latch" as used herein refers to the generic sense of operation where a device has an input, an output and a control line, and where following a trigger event the output is held steady irrespective of changes occurring at the input.

The "latching" function can be implemented by combinational logic functions such as a D type flip-flop or a D type latch. From a review of textbooks it appears that some authors regard the terms as being synonymous. However, some workers in the art ascribe precise and different meanings to the terms. In particular a latch is regarded as a level triggered device whereas a flip-flop is sometimes regarded as an edge triggered device.

In order to avoid confusion, a device that provides a generic latching function will be referred to herein as a "latch". If a specific need to describe the device as being level triggered is identified, then the device will be described as being a level triggered latch. Where the edge triggering nature of a device is important, then it will be described as being edge triggered, for example an edge triggered flip-flop.

Also, in general, a latch (when not used in the generic sense) describes a device that when not in the latched mode propagates the signals at its input directly to its output.

According to a third aspect of the invention, there is provided a counter circuit comprising a plurality of latches arranged in a chain, each latch arranged to operate in a first mode of operation where, in response to a mode control signal, a latch is arranged to latch a data signal received at a first input of the latch and in a second mode of operation where, in response to the mode control sign the latch is arranged to pass said data signal directly to the input of a subsequent latch in the chain.

It is thus possible to provide a counter circuit having a plurality of elements arranged to shift a single logic "one" from one element to a succeeding element in response to a clock signal, and wherein each element is further responsive to a select signal for selecting the element such that, if the element is selected, it participates in the shifting of the signal, and if not selected the element merely propagates the signal.

Such a counter circuit is preferably associated with a control register such that the mode control signal for the or each element in the circuit is held by the register. Advantageously an output gate is also controlled in response to the mode control signal such hat internal transient signals propagating through the circuit are not propagated from outputs of unselected ones of the elements. Thus the mode control signal acts to select whether a latch and associated gate will participate in the formation of a shift or ring counter; or whether the latch will effectively function as a wire and the gate will be held at a predetermined output.

Preferably each element comprises at least one latch, for example a D (delay) type latch and means for inhibiting the latching operation of the latch. A first inhibiting means may be provided by effectively removing the latch from the chain of elements when it is not selected and bypassing it with a suitable logic gate or combination of gates.

In a preferred arrangement, each element in the latch comprises first and second D type level triggered latches arranged in series, the D input of the first latch is arranged to receive data from a preceding element, or from a injection node in the case of the first element in the chain. The output of the level triggered D type latch is provided to the D input of the second level triggered D type latch, and the output of the second latch is then provided as an input to a subsequent element. Level triggered D type latches have the property that the input signal occurring at the data input is immediately propagated (subject to internal gate propagation delays) to the output thereof whilst the 'clock' signal at a clock input is in a first logic state, and the data is latched when the clock is at a second logic state. Advantageously a master clock is provided from a clock line to the clock input of the first level triggered D type latch via a suitable gate, such as an AND or NAND gate, such that transitions on the clock line only occur if an element select signal supplied to one of the inputs of the gates is selected, and such that, if the gate is not selected the D type latch is arranged such that it is held in a mode where the signal at the data input is propagated directly to the output thereof. Similarly, the second D type latch has its clock signal provided through a gating arrangement such that, if the particular element is not selected it is also arranged such that data always propagates directly from its D input to its output.

BRIEF DESCRIPTION OF THE DRAWINGS

The present invention will be further described, by way of example, with reference to the accompanying drawings, in which.

DESCRIPTION OF EMBODIMENTS OF THE INVENTION

Figure 1:
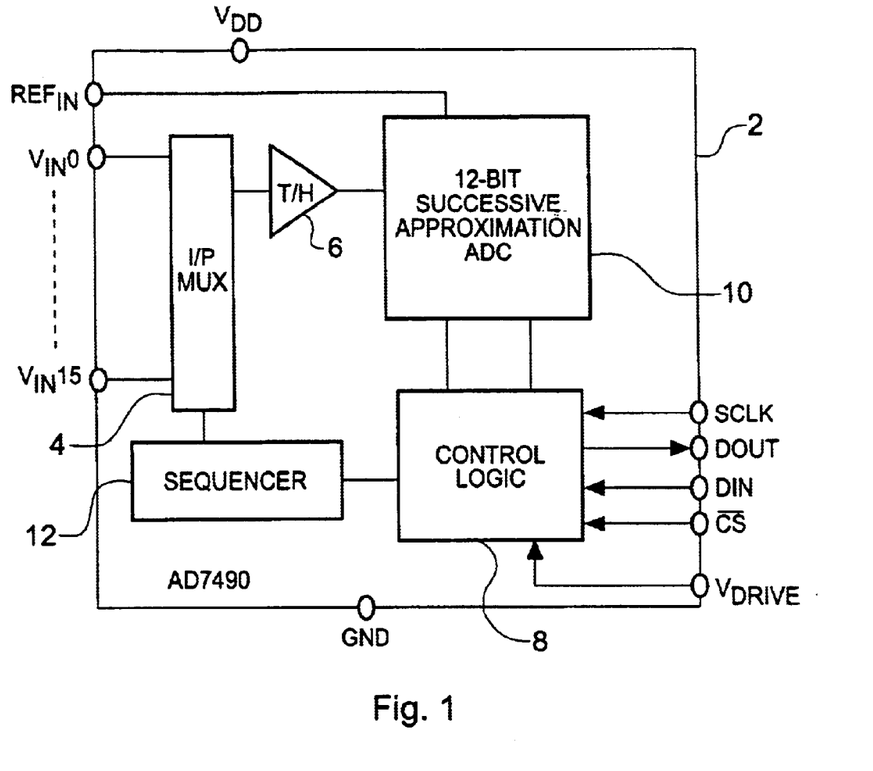
FIG. 1 schematically illustrates the internal configuration of an analog to digital converter constituting an embodiment of the present invention.

Referring to FIG. 1, the analog to digital converter generally indicated 2 comprises an input multiplexer 4 arranged to receive inputs $V_{in}0$ to $V_{in}15$ and to supply one of these inputs to a track and hold element 6 which in turn, in response to a select signal provided by control logic block 8, holds the input signal supplied thereto for a period long enough for a 12 bit successive approximation analog to digital converter 10 to derive a digital representation of the analog signal provided at the selected one of the inputs $V_{in}0$ to $V_{in}15$. The multiplexer 4 is controlled by a sequencer 12 which, as will be described more fully hereinafter, allows for automatic cycling through all of the inputs, automatic cycling through a user defined sub-selection of the inputs, or each input to be selected explicitly by virtue of its address. The control logic 8 handles the digital interface with the outside world, including receiving instructions for control of the analog to digital converter 2, implementing those instructions, and modifying the responses returned from Me analog to digital converter 10 in such a way that it matches the user's requirements.

Figure 2:
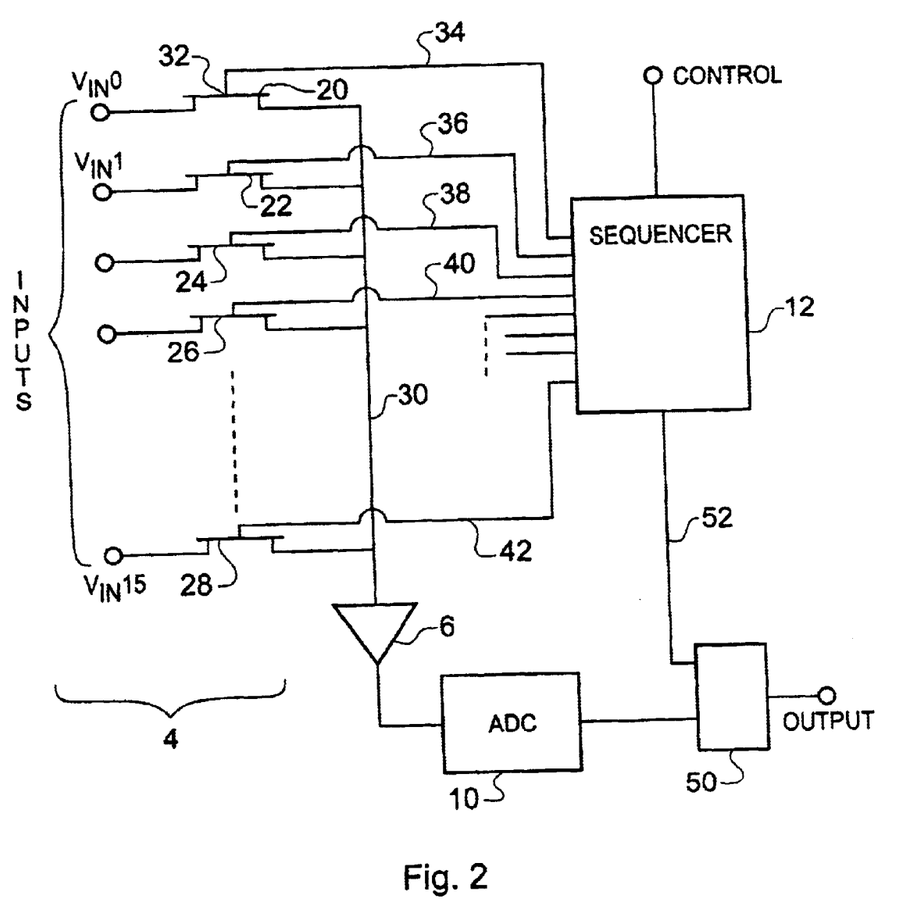
FIG. 2 schematically illustrates the multiplexer of the converter of FIG. 1 in greater detail.

FIG. 2 schematically illustrates the arrangement of the sequencer 12 and the multiplexer 4 in greater detail. The multiplexer 4 has, in this example, sixteen inputs labelled $V_{in}0$ to $V_{in}15$. Each of these is connected to a common input of a track and hold 6 via respective switches, of which only five switches 20, 22, 24, to 26 and 28 are shown for clarity. Each switch is for simplicity regarded as being in the form of a field effect transistor which is connected such that the drain thereof is connected to the respective input, and the source thereof is connected to a common rail 30 leading to the input of the track and hold 6. In practice the switch will be in the form of a transmission gate fabricated from PMOS and NMOS transistors in parallel. A gate, for example, gate 32 of transistor 20 is connected to a respective control line from the sequencer. Thus, transistor 20 is controlled via control line 34, transistor 22 via control line 36, transistor 24 via control line 38, transistor 26 via control line 40 and transistor via control line 42.

The sequencer is arranged to control the transistors 20, 22, 24, 26 and 28 such that only one transistor can be switched into a conducting state at any one time. This is to avoid the possibility of two transistors being on, for example transistors 20 and 22 thereby effectively shorting their respective inputs $V_{in}0$ and $V_{in}1$ together.

Once an input has been selected, for example, input $V_{in}1$, the sequencer switches the transistor for that input, in this case transistor 22, on such that a signal is supplied from the input to the track and hold 6. The track and hold 6 is well understood by persons skilled in the art and need not be described further here, except to say that a track and hold is functionally equivalent to the equally well known sample and hold circuit, although it does not suffer from slew rate limiting or parasitic capacitance to quite the same extent.

Once the hold signal is asserted, the analog to digital converter 10 performs a successive approximation conversion using a digital to analog converter and a comparator, again as well understood by the skilled person in the art. The output of the converter 10 is combined at an output element 50 with a further output 52 of the sequencer 12, the output 52 providing a binary coded word, or other suitable symbol, indicating the channel identity of the channel which has been or is currently being converted.

Figure 3:
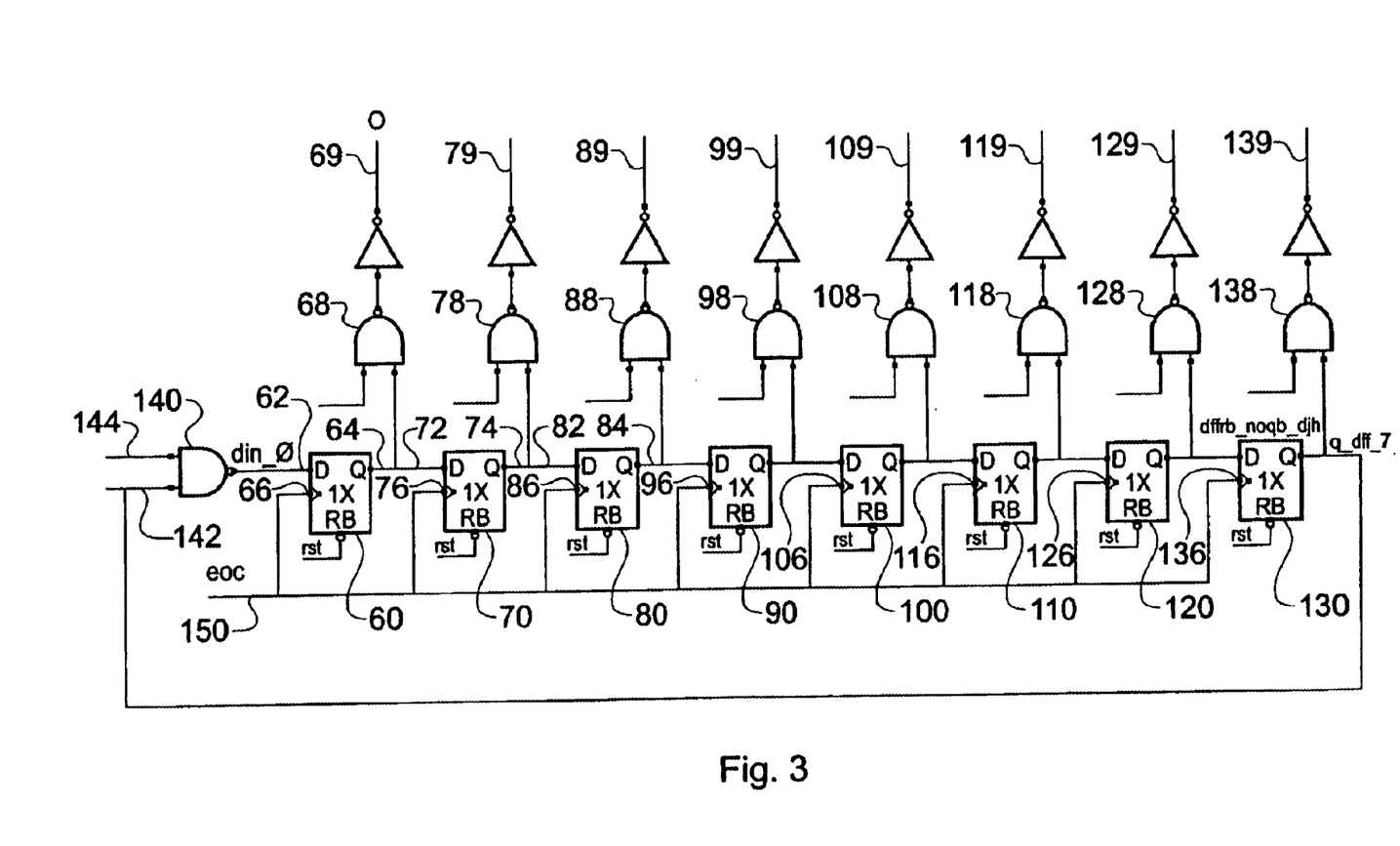
FIG. 3 schematically illustrates a ring counter arrangement not constituting part of the present invention.

Conventionally, multi channel converters having sequencers therein operate by converting each of the channels in succession. Thus, a travelling '1' would be sequentially walked through each of the control lines 34, 36, 38, 40 and 42 in secession before being returned to the first control line 34. This process would happen indefinitely. FIG. 3 schematically illustrates a prior art arrangement for achieving this. FIG. 3 schematically shows eight D type falling edge triggered flip-flops labelled 60, 70, 80, 90, 100, 110, 120 and 130. The flip-flops are arranged such that a non inverting output 64 of the D type flip-flop 60 is provided to the data input 72 of the flip-flop 70. The non inverting output 74 of the flip-flop 70 is provided to the data input 82 of the flip-flop 90. The non inverting output 84 of the flip-flop 80 is provided to the data input 92 of the subsequent flip-flop 90, and this sequence of events is repeated up the chain until the last flip-flop 130 is reached. The non inverting output from the flip-flop 132 is returned to the data input 62 of the first flip-flop 60 via a suitable gating arrangement, such as an OR gate, or as shown in FIG. 3 through a NAND gate 140 having an inverting input 142, which is a functional equivalent of an OR gate. The gate 140 has a further input 144 which is connected to a circuit for generating a transitory logic '1' signal such that one '1' can be propagated into the counter arrangement following a reset or power up condition.

As shown, each of the flip-flops 60 to 130 has a clock input 66, 76, 86, 96, 106, 116, 126 and 136 which are connected to a common clock line 150. The D type flip-flops 60 to 130 are, in this example, arranged to be edge triggered such that it is only the falling edge of the clock signal, which is a square wave, which causes the input of the D type flip-flop to be propagated and held at its output (it is of course possible for the person skilled in the art to implement this circuit using rising edge triggered flip-flops). Thus, if following reset a logic 1 is introduced on line 144, and then the clock 150 undergoes a high to low transition, a logic 1 will appear at the output 64 of the first D type 60. The signal on input 144 is then removed and replaced by a logic 0. If the clock 150 is then driven with a square wave, such that the signal repeatedly undergoes transitions between the logic low and logic high levels, and then from the logic high to logic low levels, at each falling edge the logic '1' is advanced from one flip-flop to the next flip-flop, one step at a time. Once the logic '1' reaches the final D type flip-flop 130, it is returned to the first flip-flop 60 via the gate 140. Thus, a single one can be endlessly propagated around the chain of flip-flops.

As shown, each flip-flop is associated with a respective NAND gate 68, 76, 88, 98, 108, 118, 128 and 138 which receives the output of its associated D type flip-flop at one input thereof. Each NAND gate only has two inputs, and the other input thereof is provided with a control signal from a control register (not shown) which can be used to inhibit propagation of the output of any one of the D type flip-flops 60 to 130 to an associated output node 69, 79, 89, 99, 109, 119, 129 and 139.

In this arrangement, a control word loaded into the control register can be used to inhibit the output of any one of the nodes 69 to 139 attaining the logic level '1'. However, if an output is inhibited it is still 'counted' within the ring counter formed by the chain of D type flip-flops 60, 70, 80, 90, 100, 110, 120 and 130. Thus, for this 8 output ring counter illustrated in FIG. 3 even if only one of the D type flip-flops, for example 80, was selected such that its respective output could obtain a logic '1' with all of the other flip-flops being controlled such that their respective output nodes were held at logic '0', then the time taken to cycle around the counter would be 8 clock pulses, with seven of these clocks being effectively wasted. Thus, the time taken to cycle around the counter is invariant of the number of outputs enabled.

This waste of time becomes more significant as the number of channels is increased.

Figure 4:
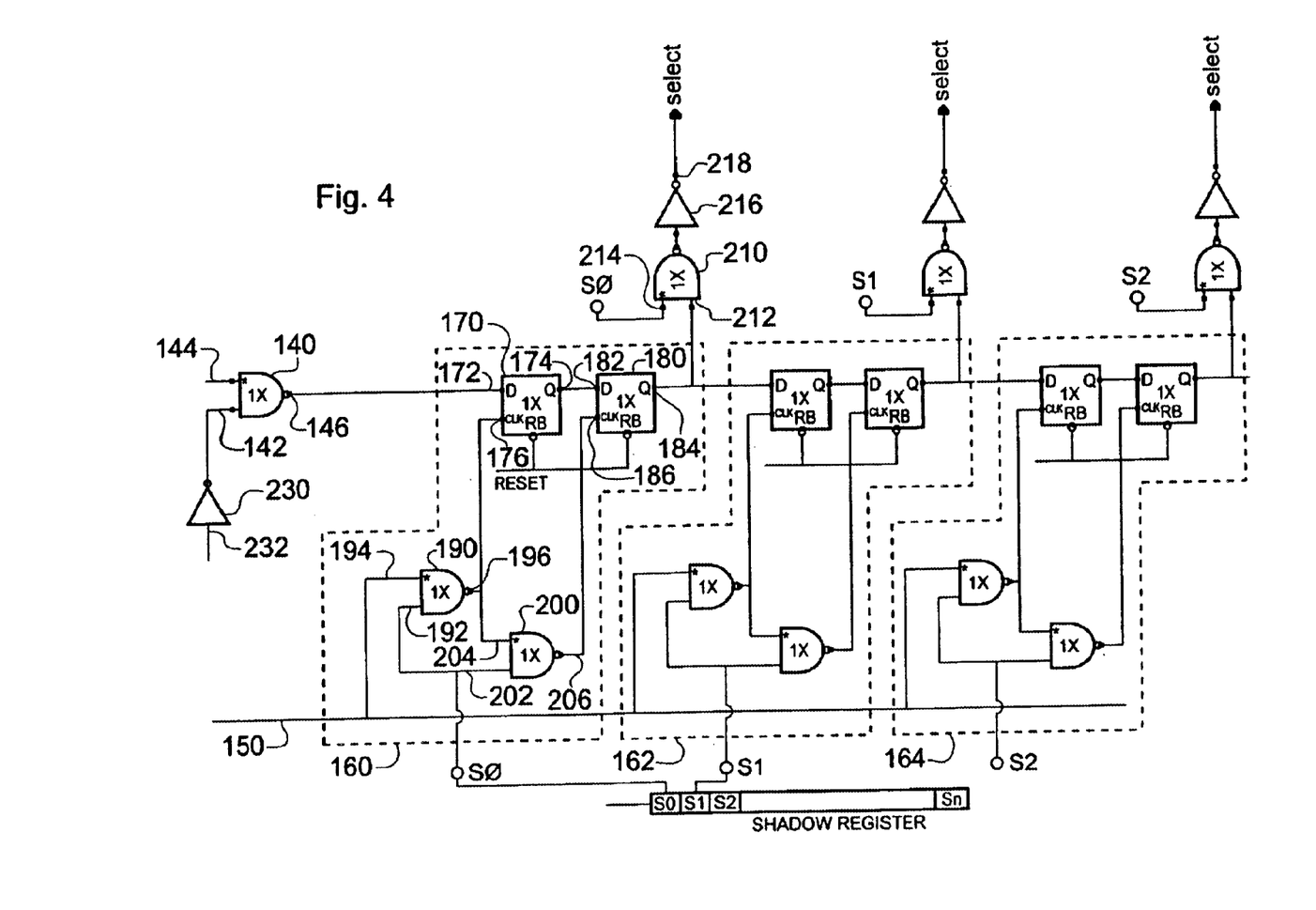
FIG. 4 schematically illustrates a ring counter constituting an embodiment of the present invention.

FIG. 4 schematically illustrates three circuit blocks 160, 162 and 164 which effectively replace the D type flip-flops 60, 70 and 80 in FIG. 3. The remaining D type flip-flops are also replaced by the functional blocks shown in FIG. 4. Each block is identical, and consequently only one will be described in detail for the sake of brevity. Block 160 comprises first and second level triggered D type latches 170 and 180. A data input 172 of the first latch 170 serves as a data input to the block 160, and as such is equivalent to input 62 of FIG. 3. A non-inverting output 174 of the latch 170 is provided to a data input 182 of the level triggered D type latch 180. A non-inverting output 184 of the latch 180 provides an output of the functional block 160 and hence is equivalent to output 64. The latches 170 and 180 are arranged such that if their clock inputs 176 and 186 are in a first allowed state, for example logic '1' then the signal at their respective data inputs 172 and 182 is propagated directly to their non inverting (Q) outputs 174 and 184 respectively. However, if the clock signals 176 and 186 are in another logical state, for example logic '0' then the latches latch the data at their data inputs such that the Q outputs 174 and 184 remain unchanged even if the signals at the data inputs 172 and 182 vary. The clock signals 176 and 186 are derived through NAND gates 190 and 200. A first input 192 and 202 of each NAND gate 190 and 200, respectively, is connected to receive a select signal, in this case labelled S0 as it is the select signal for the zero 'counter' in the ring counter formed by these gates. Element 162 has a select signal of S1, element 164 a select signal S2 and so on. The select signals S0 to S15 are stored in a control register, which in the commercial embodiment of the invention is referred to as a "shadow register". In the arrangemen shown in FIG. 4, if S0 has a logic '1' then the block 160 is selected whereas if S0 is at a logic '0' then the block 160 is deselected and is effectively removed from the chain of counters as will be described in greater detail hereinafter. A second input 194 of NAND gate 190 is connected to a clock signal line 150. If signal S0 is at a logic '1', then the signal occurring at an output 196 of the NAND gate 190 is an inverted version of the clock signal 150. Thus, if clock 150 is low then the signal at the clock input at 176 of the first D type latch 170 is high and the signal at the input 172 thereof is propagated to the output 174 thereof. As the clock 150 goes high the signal at the clock input 176 of the D type latch 170 goes low, and consequently the output 174 thereof becomes latched such that a subsequent change to the input 172 does not affect the output 174 whilst the clock 176 remains low.

The output 196 of the NAND gate 190 is also provided to a second input 204 of NAND gate 200. Thus, provided that S0 is at a logic '1' the signal at an output 206 of NAND gate 200 is an inverted version of the signal at the output 196 of NAND gate 190. The output 206 is connected to the clock input 186 of the second D type latch 180. Thus, provided S0 is at a logic '1' the clock inputs 176 and 186 are also the inverse of each other. Thus, if gate 170 is effectively 'transparent', that is the signal at the D input 172 is propagated to the output 174 because the clock 176 is at a logic 1, then gate 180 is 'opaque' in that changes occurring at its D input 182 are not propagated to its Q output 184, but the output 184 remains latched in its present state. Thus, in one complete clock cycle a signal occurring at the input 172 can be propagated, in a latched mode, to the output 184. Thus, the unit 160 functions as if it were a normal D type flip-flop. Indeed, it can be seen from examination of the clock propagation path through the NAND gates 190 and 200 that output 184 is updated when the clock signal 150 goes high. Thus the functional block 160 behaves as if it was a single rising edge triggered flip-flop and thus is a functional equivalent to the flip-flop shown in FIG. 3. However, if S0 is held at a logic state '0', thereby indicating that functional unit 160 is not selected then the output of NAND gate 190 becomes a logic '1' irrespective of the state of the clock 150. Similarly, the output 206 of NAND gate 200 also becomes a logic '1' irrespective of the state of the clock 150. When this occurs, both D type latches 170 and 180 become 'transparent' such that the signal occurring at input 172 is propagated to output 184 immediately (or at least subject to internal gate delays). Thus, the input 172 is effectively directly connected to the output 184 and the gate 160 is thus shorted out. In essence, it functions as if it was a wire. The output 184 of the D type latch 180 is buffered via a further NAND gate 210 which receives the output 184 at a first input 212 thereof and the select signal S0 at a second input 214 thereof. An output of the NAND gate 210 is supplied to an inverter 216 whose output 218 is used as a drive signal to an associated one of the transistors switches in the multiplexer. Thus, if S0 is at a logic '0' state, the output 218 will always be low and any transitory signals propagating through the element 160 will not get inadvertently propagated to the output 218 and hence to an unselected channel.

Thus if, as before, the blocks 160, 162, 164 and so on are selected, then a single logic '1' can be sequentially propagated around the ring of such blocks in a conventional manner. However, if some of the blocks are not selected, by placing their selection signal SN at a logic '0', where N represents the sequence number of the block, then that block is effectively removed from the chain and the time taken to propagate the single '1' around the chain of blocks is substantially directly proportional to the number of blocks in the chain.

As with the arrangement shown FIG. 3, the output of the final counter (flip-flop) in the chain (not shown in FIG. 4 is propagated back to the input of the first counter shown in FIG. 4 via gate 140. Gate 140 has herein been described as an OR gate, but the functionality thereof, together with the ability to propagate only a single logic '1' into the counter chain can be provided by a NAND gate in combination with the circuit shown in FIG. 5.

The truth table of a NAND gate is well known. If both its inputs are high then its output is low, if both its inputs are low, then its output is high, and if one input is high and the other is low then the output is high. Thus, as shown in FIG. 4, if gate 140 is implemented as a NAND gate, then its first input 142 needs to be connected to an output of an inverter 230, which in turn has its input 232 connected to the Q output of the last counter in the counter chain. The second input 144 is connected to the circuit shown in FIG. 5.

Figure 5:
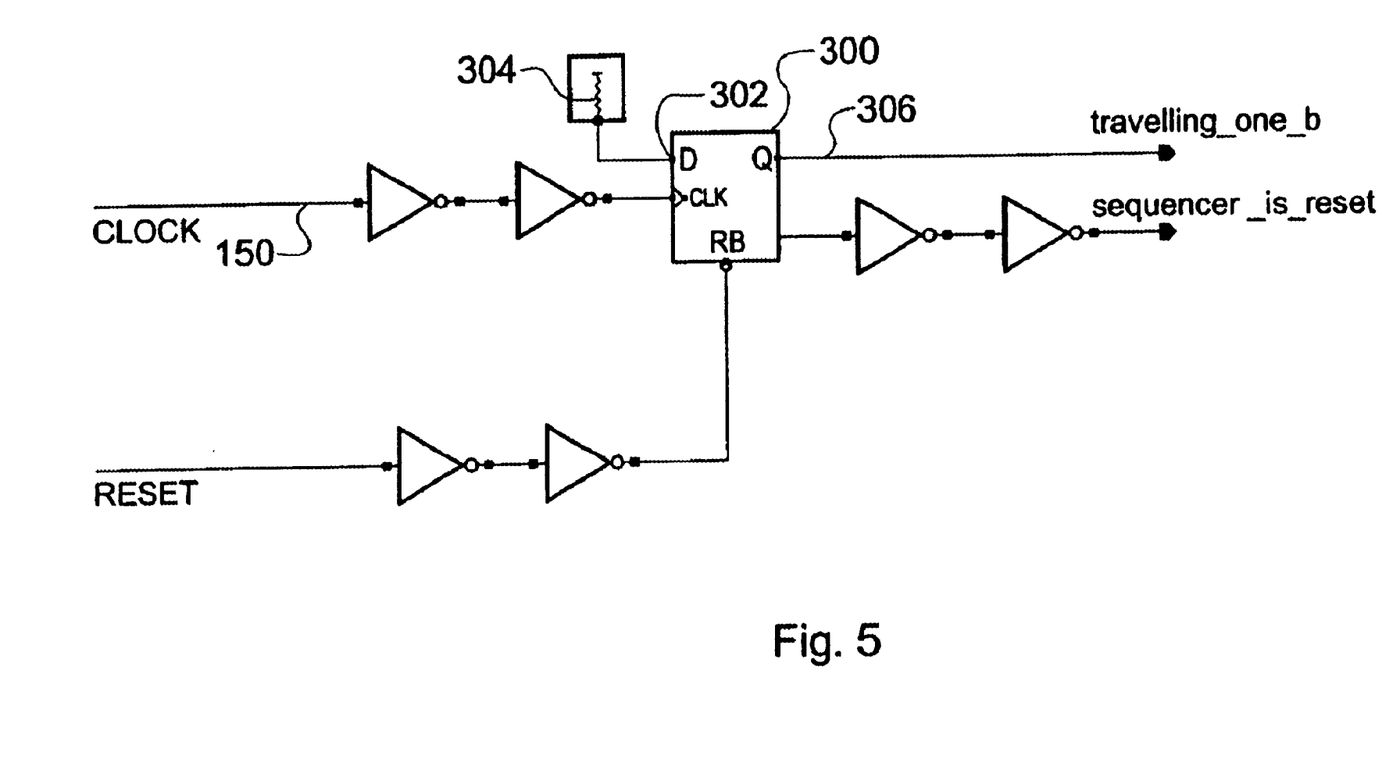
FIG. 5 illustrates a circuit for seeding the ring counter of FIG. 4 with a single '1'.

The arrangement shown in FIG. 5 comprises a D type edge triggered flip-flop 300 which has its data input 302 permanently connected to the positive supply rail via a pull up resistor 304. The Q output 306 of the flip-flop 300 is connected to the input 144 of NAND gate 140. The D type flip-flop 300 also receives the clock signal 150 and a reset signal 'reset'. Upon receipt of the reset signal, D type flip-flop 300, and all of the latches in the counter circuit as shown in FIG. 4 reset, thus all of the outputs thereof become logic '0'. In this state it becomes necessary to propagate a single '1' into the counter formed by the chain of latches.

Immediately following the reset condition the output of the final counter (block) in the chain is at a logic '0', and hence this signal is provided to input 232 of the inverter 230. Thus, the input 142 of NAND gate 140 receives a logic '1'. However, the output 306 from the D type flip-flop 300 is at a logic '0' consequently the output 146 of the NAND gate 140 is at a logic '1'. At the first clock pulse 150 following removal of the reset signal, this logic '1' occurring at the output 146, and hence at the input 172 is clocked into the D type flip-flop 170. Simultaneously, the logic '1' occurring at input 302 of D type 300 is clocked to its output 306 thereof so that the input 144 of gate 140 will now always see a logic '1' until the next reset occurs. At this time, both inputs 142 and 144 are at logic '1' and hence the output 146 becomes logic '0'. Thus, a single '1' has been propagated into the counter chain.

In the arrangement shown in FIG. 4, the clock signal 150 may either be derived from counting down a clock, SCLK, used to clock the analog to digital conversion, or may be derived from an end of conversion signal which is produced by the converter once it has finished its conversion on a given channel. Thus, if it is known that the conversion by successive approximation takes 16 SCLK clock cycles, then the clock 150 for the shift register can be obtained by dividing the SCLK clock by sixteen.

As shown on FIG. 1, the device need only have a few control pins. In the example shown, apart from the analog input pins $V_{in}0$ to $V_{in}15$, a reference voltage $REF_{IN}$ and the supply voltages $V_{dd}$ and ground (gnd) the device also has a chip select, $\overline{CS}$. This pin has the dual function of initiating data conversion within the circuit and also framing the transfer of serial data between the circuit and other devices. A serial output pin DOUT provides the conversion result of the converter. The output bits are clocked out at the serial clock rate, with, in this example, the bits being clocked out on the falling edge of the serial clock SCLK. As described hereinbefore, the data stream consists of four address bits indicating which channel the conversion result corresponds to, followed by 12 bits of conversion data with the most significant bit first. The output coding may be selected as straight binary or as two's complement via a coding bit selected in a control register.

A data in pin, DIN, is a pin which allows the serial data to be written into a control register held within the control unit 8 and, if appropriate, also to the shadow register (FIG. 4) which is used to indicate which selected ones of the channels should be converted. Data is clocked into this input on the falling edge of the serial clock. Finally, in order to enhance interfacing between this device and logic families using different logic voltages, a voltage drive ($V_{DRIVE}$) pin is provided which determines what voltage the serial interface of the chip runs at.

Figure 6:
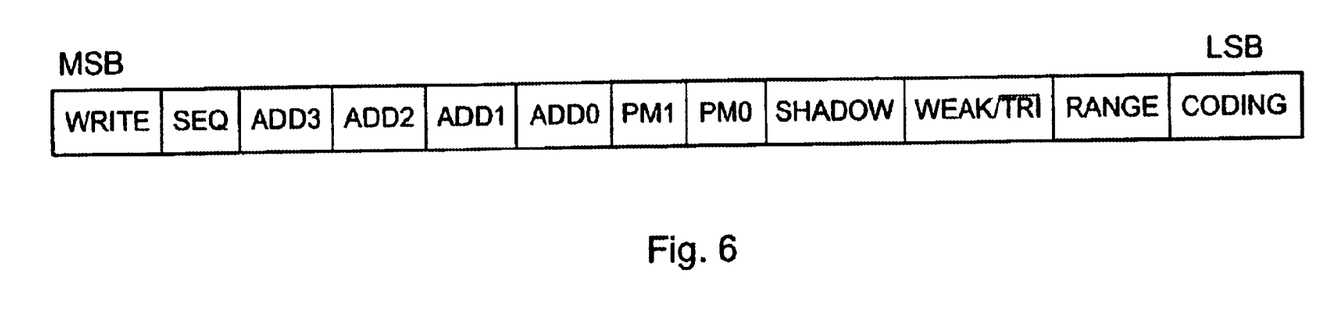
FIG. 6 illustrates a control register of the converter shown in FIG. 1.

In order to control the device, control words can be written into the control unit 8 via the data in, DIN, pin. A first example of a control word is shown in FIG. 6. In this example the control word is twelve bits long starting at the most significant bit, the first bit is a write control bit which if set, indicates that the following eleven bits should be loaded into the control register. If the write bit is a '0' then the remaining eleven bits are not loaded into the control register and so it remains unchanged from its previous status.

Following the write bit is a SEQ bit which, in combination with a subsequent shadow bit, controls the operation of the sequencer 12. The next four bits, ADD3, ADD2, ADD1, ADD0 indicate the explicit number of the next channel to be converted. These bits may also be used to indicate the number of the final channel which is to be converted in a consecutive sequence. The next two bits PM1 and PM0 are power management bits and determine the levels of shutdown that may be applied to the device. The next bit is the shadow register bit whose operation will be described hereinafter. The next bit is the weak/$\overline{TRI}$ which sets the state of the data out line at the end of the current serial transfer. If this bit is set to '1' then the data out line will be weakly driven to the channel address bit ADD3 of the ensuing conversion. However, if this bit is set to zero then the data out will return to a high impedance condition at the end of the serial transfer.

The next bit is a range bit which controls the analog range of the converter. If this is set to zero then the analog input range extends from zero volts to two times the voltage at $REF_{IN}$ for the next conversion However, if it is set to one then the analog input range extends from zero volts to $REF_{IN}$ for the next conversion. The final bit is a coding bit which is used to set the style of the coding applied to the conversion result. If it is set to zero then the output coding will be two's complement, whereas if it is set to one then the output coding will be binary.

Figure 7:
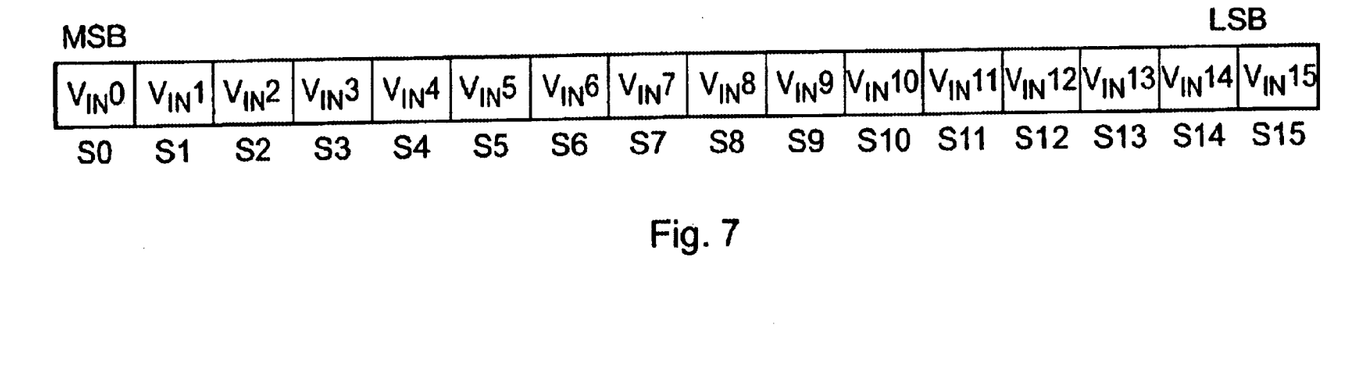
FIG. 7 illustrates a shadow register of the converter shown in FIG. 1.

Following the control word, there is also an option to write a sixteen bit word into the shadow register, with each one of the bits indicating whether one of the inputs $V_{in}0$ to $V_{in}15$ will be converted or not in the next conversion sequence. These bits are held in a register, the outputs of which provide the signals S0 to S15.

Returning to the power management bits, the power is managed in accordance with the following criteria.

| PM1 | PM0 | Mode |
|---|---|---|
| 1 | 1 | This is the normal mode of operation and a device remains in its full power mode regardless of the status of any of the other inputs. |
| 1 | 0 | This causes the device to enter shutdown, whilst retaining the information in the control register. |
| 0 | 1 | Auto shutdown. In this mode the device automatically enters shutdown at the end of conversion. |
| 0 | 0 | Auto standby, in this mode the converter is mainly powered down, but the on chip bias generator remains powered up and the chip can be repowered within one clock cycle. |

The sequence and shadow register bits are used to control the way in which the channels are converted. If both the sequence and shadow register bits are set to zero, this means that a sequence function is not used. The identity of the input channel to be converted is decoded from the address bits ADD3 through to ADD0 of each preceding data write operation. This mode of operation reflects traditional operation of a multi channel analog to digital converter without the sequencer function being used.

If the sequence bit is set to zero, and the shadow bit is set to one, then this configuration selects the shadow register for programming. The next data input write operation will load the contents of the shadow register and hence will programme the sequence of channels to be converted on each successive valid $\overline{CS}$ falling edge. This sequence will continue until interrupted by a suitable command issued to the converter.

If the sequencer bit is set to one and the shadow bit is set to zero, this indicates that the sequence function will not be interrupted upon completion of a write operation. This allows other bits in the control register to be altered between conversions whilst in a conversion sequence without terminating the sequence.

If SEQ is set to one, and SHADOW is set to zero, this configuration is used in conjunction with the channel address bits ADD3 to ADD0 to program channel conversions on a consecutive sequence of channels starting at channel zero and finishing at a final channel as determined by the number (address) programmed into ADD3 to ADD0 bits in the control register. This sequence will continue until interrupted by an external command.

Figure 8:
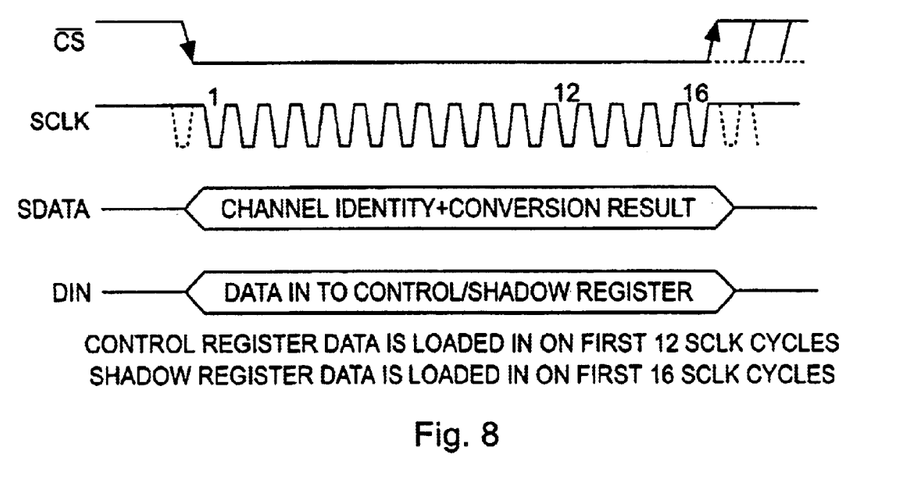
FIG. 8 schematically illustrates a timing diagram for the converter shown in FIG. 1.

FIG. 8 schematically illustrates a timing diagram for the device shown in FIG. 1 during an analog to digital conversion. Clock signals occurring on the SCLK line are ignored until such time as the chip select, $\overline{CS}$ is asserted. As this occurs, the currently selected channel in the conversion sequence, is held by the track and hold unit 6. The successive approximation converter can then commence its bit trials on each successive falling edge of the seal clock SCLK, to obtain a digital representation of the analog value. The most significant bits of the converted result can be written out on the data out bus before the least significant bits have been determined. The first four bits of the serial data indicate the identity of the channel that has been converted.

At the same time, data may be loaded into the control register or the shadow register within any conversion period as framed by the chip select signal. Control data is loaded in the first twelve clock cycles, whereas shadow register data is loaded in the first sixteen clock cycles.

Although the operation of a counter circuit in accordance with the present invention has been described in terms of walking a '1' through a field of '0's, it is of course possible to invert the logic and walk a '0' through a field of '1's.

It will be appreciated that the counter may equally be arranged to count "backwards" if suitable direction control logic is provided.

It is thus possible to provide a versatile analog to digital converter which may convert any one of a plurality of channels in numerical order; which can automatically and continuously convert a contiguous sub-selection of channels starting at channel zero and finishing at a pre-determined channel as specified by the user on a channel by channel basis, the sequence continuing until interrupted by an external instruction; or which may automatically and continuously cycle in order through a selection of channels, the length of the cycle being proportional to the number of channels selected and the sequence continuing until interrupted by an external instruction or by a user (ie other hardware); and which may convert any single channel as specified by a user or a command device.

What is claimed is:

1. An analog to digital converter, the converter comprising: N input channels, where N is a positive integer; a converter for producing a digital representation of an analog signal supplied to the converter; a multiplexer, and a sequencer for controlling the operation of the multiplexer, and wherein in a first mode of operation the sequencer is responsive to an N bit control word, wherein portions of the control word are associated with individual ones of the channels and define whether the associated channel is selected for conversion and wherein any one or more of the channels can be converted in sequence in response to the control word, the unselected channels being skipped, such that the time required to convert the sequence of channels defined in the control word is proportional to the number of channels selected by the user in the control word, and wherein the N bit control word can be modified during the conversion of any one of the channels.

2. An analog to digital converter as claimed in claim 1, wherein within the sequence the channels are converted in order of channel number and any given channel is only converted once.

3. An analog to digital converter as claimed in claim 1, further comprising a controller for controlling operation of the converter, and wherein user instructions concerning the sequence of channels to be converted are written to the controller via a digital interface.

4. An analog to digital converter as claimed in claim 1, wherein the digital representation of the analog signal is associated with the identity of the channel converted.

5. An analog to digital converter as claimed in claim 1, wherein the control word is N bits long with each individual bit being associated with a respective one of the channels.

6. An analog to digital converter as claimed in claim 5, in which an ith bit is associated with an ith channel, where i is an integer in the range one to N.

7. An analog to digital converter as claimed in claim 5, wherein the control word is held in a special purpose register, and outputs of the register are provided to respective inputs of the sequencer.

8. An analog to digital converter as claimed in claim 7, wherein the sequencer includes a plurality of registers arranged so as to form a chain, and wherein each register has an output that can be in either a first state or a second state, and wherein, in use, one register is in the first state and each of the other registers is in the second state, and wherein response to a shift signal, the registers sequentially pass the first state along the chain, with each register corresponding to a non-selected channel effectively being by-passed.

9. An analog to digital converter as claimed in claim 8, wherein each register comprises a latch having an input and an output and is responsive to a clock signal provided at a clock input such that, in response to a predetermined event in the clock signal, the signal at the input is latched by the register and a representation of that signal is provided at the output thereof if the register is selected by a select signal.

10. An analog to digital converter as claimed in claim 9, wherein each register comprises first and second logic elements, each logic element having an input, an output and a respective clock input, wherein the input of the first logic element serves as an input to the register, the output of the first element is connected to the input of the second element and the output of the second element serves as the output of the register, and wherein the respective clocks of the logic elements one normally driven in anti phase such that when one of the clocks is in a first state, the other clock is in a second state, and vice versa.

11. An analog to digital converter as claimed in claim 10, wherein, when the clock is in the first state the output of the logic element tracks the input thereto.

12. An analog to digital converter as claimed in claim 11, wherein each register is further responsive to a respective channel select signal and wherein, in the event that the channel is not selected, the clock signal to the first and second logic elements is held in the first state.

13. An analog to digital converter as claimed in claim 12, in which when not selected, the respective register acts as a buffer.

14. An analog to digital converter as claimed in claim 8, in which the output of each register is gated such that only the outputs of selected ones of the registers corresponding to selected channels can be propagated to the multiplexer.

15. A circuit comprising a plurality of latches arranged such that the output of latch is provided to the input of a subsequent latch, and wherein in a first mode of operation a latch selected by a respective latch mode control signal is arranged to latch a signal received at its input in response to a latch signal, and in a second mode of operation the input at the latch is transferred directly to its output irrespective of the state of the latch mode control signal.

16. A circuit as claimed in claim 15, wherein the circuit is arranged to sequentially shift a logic "one" through the series of latches, whereby only selected latches as selected by the latch mode control signal participate in the shifting process.

17. A circuit as claimed in claim 15, wherein the circuit is arranged to sequentially shift a logic "one" through a series of latches, whereby unselected latches as defined by a latch mode control signal are effectively bypassed or act as buffers.

18. A circuit as claimed in claim 15, wherein the circuit is arranged to sequentially shift a logic "zero" through the series of latches, whereby only selected latches as selected by the latch mode control signal participate in the shifting process.

19. A circuit as claimed in claim 15, wherein the circuit is arranged to sequentially shift a logic "zero" through a series of latches, whereby unselected latches as defined by a latch mode control signal are effectively bypassed or act as buffers.

20. A circuit as claimed in claim 15, wherein the outputs of the latches are further gated such that only the outputs of selected latches can be output.

21. A latch circuit wherein a first mode the circuit latches an input signal an in a second mode the circuit directly propagates a signal from an input of the latch circuit to an output of the latch circuit, the latch circuit comprising a first latch having an input forming the input of the latch and having an output connected to the input of a second latch, which has an output acting as the latch circuit, and wherein the first and second latches have respective clock inputs and the configuration of each latch is such that if its clock is at a first value then the signal at the input of the latch propagates to the output of the latch, and if it is at a second value then each latches its input, and wherein a clock signal to the latches is gated by a control signal such that if the control signal selects the first mode of operation the first and second latches receive their clock signals in antiphase, and if the control signal selects the second mode of operation each latch has its clock held at the first value.

* * * * *